United States Patent [19]
Bhat et al.

[11] Patent Number: 5,207,864
[45] Date of Patent: May 4, 1993

[54] LOW-TEMPERATURE FUSION OF DISSIMILAR SEMICONDUCTORS

[75] Inventors: Rajaram Bhat, Red Bank, N.J.; Yu-hwa Lo, Ithaca, N.Y.

[73] Assignee: Bell Communications Research, Livingston, N.J.

[21] Appl. No.: 814,147

[22] Filed: Dec. 30, 1991

[51] Int. Cl.$^5$ ............... H01L 21/306; B44C 1/22; B32B 31/20; C09J 5/02
[52] U.S. Cl. ................... 156/633; 156/308.2; 156/308.6; 156/643; 156/657; 156/662
[58] Field of Search ............ 156/629, 633, 643, 657, 156/662, 308.2, 308.6; 148/33.4; 437/225

[56] References Cited

U.S. PATENT DOCUMENTS

| | | | |
|---|---|---|---|
| 4,738,935 | 4/1988 | Shimbo et al. | 437/31 |
| 4,846,931 | 7/1989 | Gmitter et al. | 156/633 |
| 4,883,561 | 11/1989 | Gmitter et al. | 156/633 |

OTHER PUBLICATIONS

Z. L. Liau et al, "Wafer fusion: A novel technique for optoelectronic device fabrication and nonolithic integration," *Applied Physics Letters*, 1990, vol. 56, pp. 737–739.

Y. H. Lo et al, "Bonding by atomic rearrangement of InP/InGaAsP 1.5 μm wavelength lasers on GaAs substrates," *Applied Physics Letters*, 1991, vol. 58, pp. 1961–1963.

M. Grundmann et al, "Low-temperature metalorganic chemical vapor deposition of InP on Si(001)," *Applied Physics Letters*, 1991, vol. 58, pp. 284–286.

*Primary Examiner*—William A. Powell
*Attorney, Agent, or Firm*—Leonard C. Suchyta; Charles S. Guenzer

[57] ABSTRACT

A method of fusing together wafers (10, 30) or other semiconductor bodies comprising different semiconductors. In the case that wafers of InP and GaAs or other compound semiconductors are to be bonded, the wafers are cleaned with etchant, and their surfaces are placed together. While the wafers are forced together under moderate pressure and clean hydrogen flows over the wafers, the temperature is raised to 650° C., close to the deposition temperature for epitaxial InP, and maintained for 30 minutes. In the case that one of the wafers is silicon (FIG. 5), both wafers are assembled together in hydrofluoric acid, in which the two wafers bond together by van der Waals force. Then, the assembly is placed in a furnace and annealed at 650° C. A sharp hetero-interface (32, 66, 70) is produced with only surface defects which do not propagate into the bulk. Either wafer may be preformed with a multi-layer optoelectronic structure (12).

18 Claims, 3 Drawing Sheets

LOW-TEMPERATURE FUSION OF DISSIMILAR SEMICONDUCTORS

FIELD OF THE INVENTION

The invention relates generally to fabrication of structures of compound semiconductors. In particular, the invention relates to the fusion of two semiconductive bodies.

BACKGROUND ART

Although elemental semiconductors such as silicon have dominated the commercial market, compound semiconductors such as GAAs and InP have important uses in present and future electronics. The technology for Si has achieved startling results. Millions of transistors can be fabricated in a single integrated circuit at very low cost. The technology for GaAs has been developed over many years and is finding widespread application in very high-speed electronics. As a result, GaAs substrates have become relatively inexpensive and GaAs electronic circuitry has been integrated with thousands of transistors. Compound semiconductors find another important use in opto-electronics. While GaAs can implement optical devices around the 0.8 $\mu$m band, silica optical fibers have created an intense demand for opto-electronic integrated circuits (OEICs) in the 1.3 to 1.5 $\mu$m band. This band cannot use GaAs but requires other materials, such as the III-V semiconductor InP.

The recent activity in InP has greatly advanced its technology. However, the cost of InP substrates of the required quality significantly exceeds that of GaAs substrates. Furthermore, the complexity of fabricated InP electronic integrated circuits greatly lags behind that for GaAs ones and probably will continue to. As a result, there is a desire to combine different semiconductor materials, the principal ones being Si, InP, and GaAs and the related families of the latter two.

In heteroepitaxy, one material is epitaxially grown on a substrate of another material, e.g., InP on a GaAs substrate. In most cases, the two materials have the same zinc-blende crystal structure, but the lattice constants are substantially mismatched. Exceptional cases of lattice matching include the ternary InGaAs alloy and the quaternary InGaAsP alloys that are lattice matched to InP and the nearly lattice-matched AlAs and GaAs. However, the lattices of InP and GaAs are mismatched by 3.7%. The typical lattice mismatch results in a density of threading dislocations that cannot be reduced below about $10^6$ cm$^{-2}$. These threading dislocations propagate through reasonable thicknesses of later grown epitaxial layers, and the high defect density degrades the operation of minority carrier devices such as lasers.

In another approach, Gmitter et al. have disclosed in U.S. Pat. Nos. 4,846,931 and 4,883,561 an epitaxial lift-off procedure in which a very thin layer of a compound semiconductor crystal floating in a liquid is bonded by van der Waals force to a nearly arbitrary substrate submerged in the liquid. The van der Waals bonding occurs at room temperature and generally requires rolling pressure to remove the liquid from the interface. The strength of the van der Waals bonding is very weak compared to covalent bonding, and its reliability remains uncertain. Furthermore, epitaxial lift-off is only usable with a limited range of semiconductor composition.

In yet another approach, Liau et al. have disclosed a method of fusing together an InP wafer and a GaAs wafer in "Wafer fusion: A novel technique for optoelectronic device fabrication and monolithic integration," *Applied Physics Letters*, volume 56, 1990, pp. 737–739. They pressed the two wafers together with extreme pressure in the presence of phosphine (PH$_3$) and at temperatures of at least 520° C. and preferably 750° C. The phosphine was probably needed to prevent the decomposition of InP and agglomeration of In globules at these high temperatures. They predicted that the temperature could be further decreased, but only if the pressure were maintained. The pressure was achieved in a jig having graphite plugs sandwiching the wafers and closely fitting inside a quartz tube. The assembly was then heated, and the differential thermal expansion produced the pressure. They did not disclose a numerical value of the fusion pressure required, but we have estimated their jig to produce at least 10 kg/cm$^2$.

This fusion procedure requires a non-standard pressure apparatus for operation at these temperatures. The pressure is also considered to be too high to be easily achieved.

SUMMARY OF THE INVENTION

Accordingly, an object of the invention is to fuse together two dissimilar semiconductor wafers, for example, InP and GaAs or Si and InP.

Another object of the invention is to perform such fusion at more reasonable conditions than have been available in the prior art.

The method can be summarized as a method of fusing together two wafers by pressing them together at low pressure and at low temperature. The wafers are assembled in an environment in which the oxides of both wafers are dissolved. In the case in which both wafers are compound semiconductors, the wafers are lightly pressed together in a very clean reducing atmosphere and left at a temperature at which one of the compositions can atomically rearrange at the interface. In the case in which one of the wafers is silicon, the wafers are assembled in a strong acid, whereby they are bonded together by van der Waals forces. Thereafter, they are pressed together and annealed at the temperature at which the non-silicon composition can atomically rearrange.

DETAILED DESCRIPTION OF THE PREFERRED EMBODIMENT

We have discovered that the bonding of two semiconductor wafers of dissimilar materials can be achieved with considerably less pressure and a significantly lower temperature than those available in the prior art. The pressure is only required to hold the wafers in physical proximity. The wafers are assembled or pressed together in an environment which will reduce the oxides on both wafers. The bonding temperature is generally close to the lowest temperature used in epitaxial growth of either of the two materials.

EXAMPLE 1

In a first example of the invention, a multi-layer InP edge-emitting 1.5 μm laser structure was fusion bonded to a GaAs substrate, and its lasing characteristics were determined.

Figure 1:
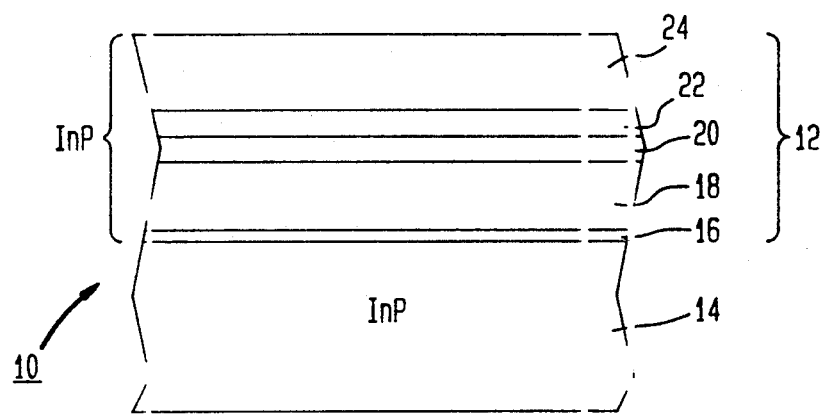
FIG. 1 is a cross-section of an InP wafer having fabricated thereon a laser.

First, a multi-layer InP body 10 was formed as illustrated in cross-section in FIG. 1. A laser structure 12 was formed on a (100)-oriented substrate 14 of InP by low-pressure (76 torr) organo-metallic chemical vapor deposition (OMCVD). All layers were epitaxially deposited and had compositions that were lattice-matched to InP. The substrate 14 had a diameter of 5 cm. First, an etch-stopping layer 16 of n-type InGaAs was deposited on the substrate 14 to a thickness of 0.3 μm. An n-type cladding layer 18 of InP was then deposited to a thickness of 2 μm. A double-heterostructure active region was then deposited. It consisted first of a 0.1 μm layer 20 of intrinsic InGaAsP having a bandgap absorption edge of $\lambda = 1.3$ μm and secondly of a 0.15 μm layer 22 of intrinsic InGaAsP of $\lambda = 1.5$ μm. The laser structure 12 was completed with a p-type cladding layer 24.

Figure 2:
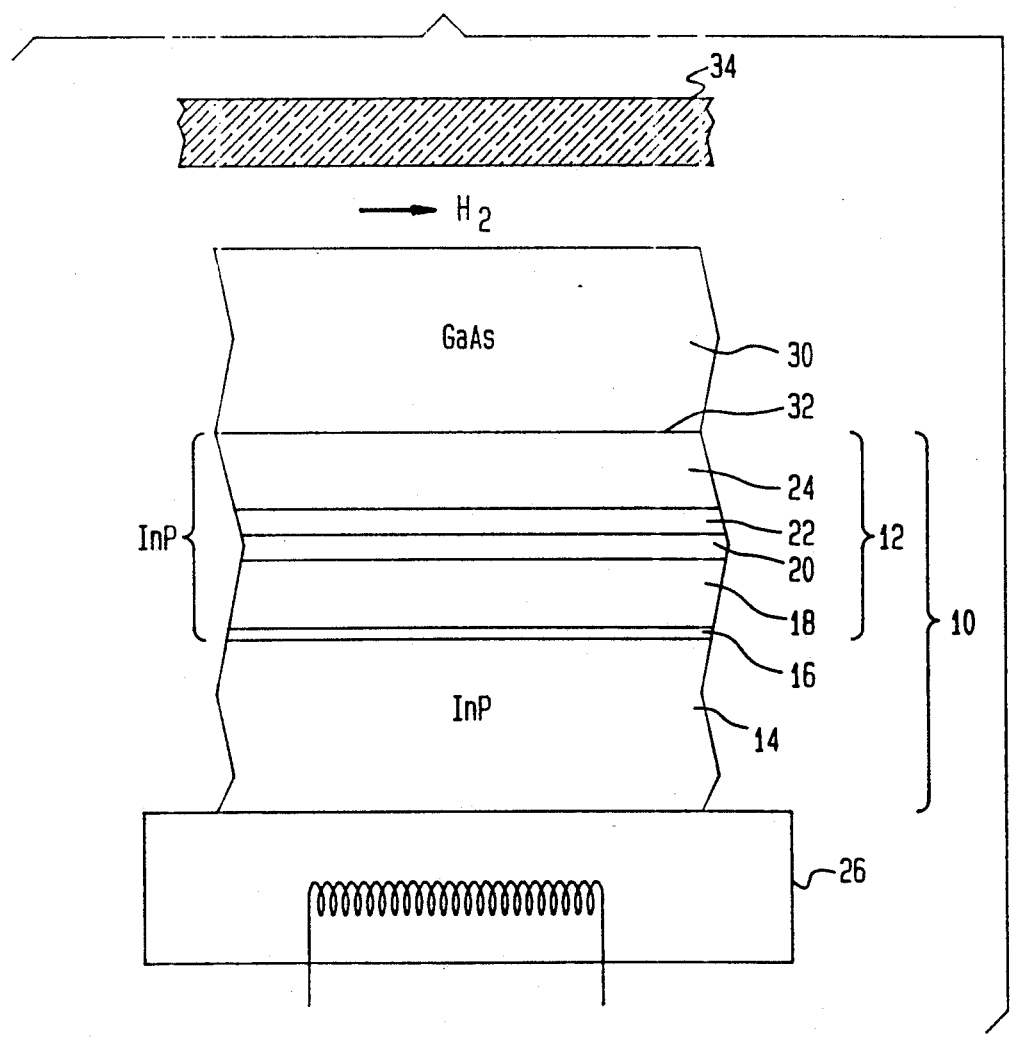
FIG. 2 is a cross-section of the InP wafer of FIG. 1 fused together with a GaAs wafer according to the invention.

The InP body 10 was removed from the OMCVD reactor, and a die measuring approximately 1 cm × 1 cm was cut out of the wafer, which was cleaned by etching in HF. The die was again placed in the OMCVD reactor on top of a graphite susceptor 26. A (001)-oriented p+-type GaAs wafer 30 having approximately the same size as the InP die 10 was also cleaned by etching in the HF and was then placed in the OMCVD reactor on top of the cleaned InP die 10, as illustrated in cross-section in FIG. 2. The last grown layer 24 of the InP die 10 faced the GaAs wafer 30 across a hetero-junction 32. The cleavage planes of the InP die 10 and the GaAs wafer 30 were aligned to within 0.2° in their crystalline orientations to allow cleaving of the lasers to form end mirrors.

To assure a close contact of the InP body 10 with the GaAs wafer 30, a 2-inch (5-cm) diameter, 200 g block of molybdenum was placed on top of the GaAs wafer 30. The 200 g weight produced a pressure of 200 g/cm². High-purity hydrogen was then flowed through the reactor having an unheated wall 34, and RF power applied to the graphite susceptor raised the temperature of the sample to 650° C. After 30 minutes under these conditions, the fusion of the InP body 10 and the GaAs wafer 30 was complete.

The temperature of 650° C. is close to the temperature at which InP-based materials are grown in this reactor and thus is close to the minimum temperature for atomic rearrangement on the InP surface. The growth temperature for GaAs-based materials ranges from 600° to 850° C. Stringfellow provides a list of growth temperatures in *Organometallic Vapor-Phase Epitaxy* (Academic Press, N.Y., 1989). At these relatively low temperatures and short time period, no substantial impurity diffusion occurs. The hydrogen acts as a reducing agent and prevents the surfaces at the interface from oxidizing. Furthermore, hydrogen is available in very pure form by diffusion through a Pd-alloy membrane.

It appears important that the semiconductor having the higher vapor pressure be placed on the heated graphite susceptor 26 and that a temperature gradient exist across the interface 32 between the two semiconductor bodies 10 and 30. A high vapor pressure corresponds to a low temperature of atomic rearrangement. In the example, the temperature gradient was achieved by the flow of cool $H_2$ and by heating only the susceptor 26 and not the wall 34 of the OMCVD reactor. Thereby, the more diffusive components of the hotter InP body 10 flowed toward the cooler GaAs body 30 and filled interfacial voids produced by irregularities of the two surfaces. A related close-space transport process has been disclosed by Wieder in the text *Intermetallic Semiconducting Films*, Pergamon Press, 1970, pp. 57–61.

Cross-sectional transmission electron microscopy (TEM) was performed on one of the fused samples. The fusion was observed to be uniform across the entire inspected region. An array of misfit dislocations was observed at the hetero-interface. They were spaced at about 10 nm, consistent with the 3.7% lattice mismatch. All interfacial dislocations were edge dislocations, known to be efficient at relaxing stress arising from lattice mismatch, and neither threading dislocations nor stacking faults were observed. Defect-free material was obtained at distances less than 2 nm from the hetero-interface.

Figure 3:
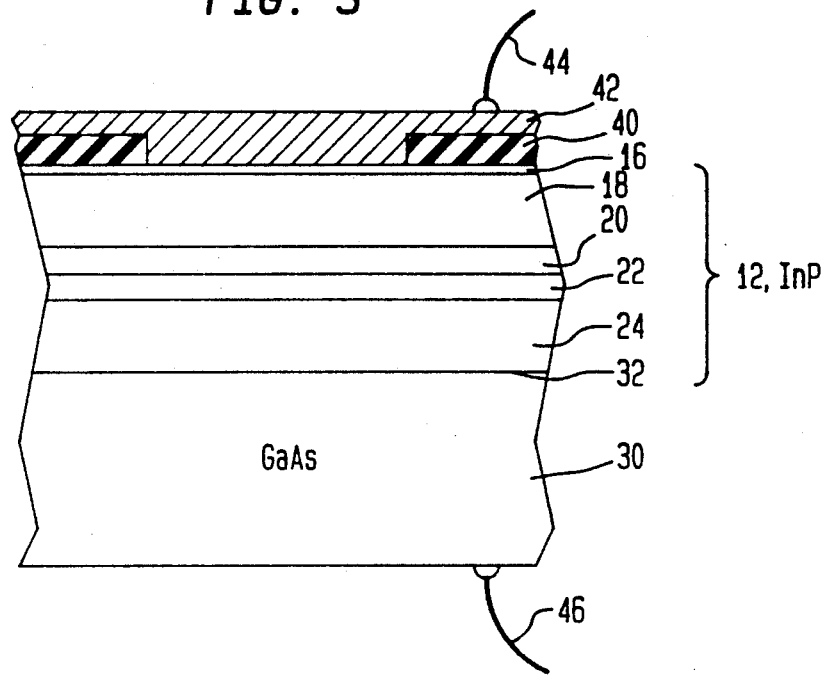
FIG. 3 is a cross-section of an InP laser joined with the GaAs wafer of FIG. 2.

Other pieces of the fused samples were used to completely fabricate lasers, as illustrated in cross-section in FIG. 3. The entire sample was dipped in $HCl:H_3PO_4$ (1:1 by volume), which etched away the InP substrate 14, but the etching stopped at the InGaAs etch stop layer 16. A laser stripe was defined by a silicon dioxide layer 40 having a 25 μm wide linear aperture. A metallization 42 of AuGeNi provided n-type alloy ohmic contact to the laser structure 12. Electrical leads 44 and 46 were attached to the metallization 42 and the GaAs substrate 30, which had been plated with Cr/Au. Samples were cleaved to have cavity lengths of 300 μm and 500 μm. Under forward bias, the lasers lased at 1.5 μm and showed a threshold current density of 1.9 kA/cm² (for 500 μm cavities), an internal quantum efficiency of 75%, and an internal cavity loss of 28 cm⁻¹. After 100 hours of CW lasing, no degradation was observed.

We have disclosed this portion of the invention in Lo et al.'s "Bonding by atomic rearrangement of InP/InGaAsP 1.5 μm wavelength lasers on GaAs substrates," *Applied Physics Letters*, volume 58, 1991, pp. 1961–1963.

COMPARATIVE EXAMPLE

For comparison, the same InP laser structure was deposited on an InP substrate in place of the GaAs substrate 30. These lasers were cleaved to have cavity lengths of 250, 500, 750, and 1000 μm. Their internal quantum efficiency, internal cavity loss, and threshold current density were nearly identical to those of the fused-structure lasers of the invention.

We believe that the low-temperature fusion occurs according to the following mechanism. After the desorption of the native oxides, the surfaces of the GaAs and InP become strongly reactive. Surface reconstructions occur on the free surfaces to reduce the surface energy. However, if the two surfaces are close enough, new chemical (covalent) bonds are formed across the hetero-interface. The bonding occurs uniformly across the entire surface because the high surface mobility of In atoms causes them to fill up the microscopic gaps and holes. On the other hand, the Ga is relatively stationary so that the two materials do not intermix. Furthermore, since the reactions occur at the surfaces, the bulk material is not affected. It is believed that the cleanliness associated with the pre-etching, the OMCVD reactor chamber, and the ultra-clean hydrogen flow permits fusion by atomic rearrangement at lower temperature and pressure than the conditions required by the fusion by mass transport of Liau et al.

Although the example above involved the fusion of InP and GaAs wafers, the invention is not so limited. The fused materials may be epitaxial layers formed on other substrates. Although only binary III-V semiconducting compounds were used in the example, ternary and quaternary compounds will involve the same mechanisms for low-temperature, low-pressure fusion. Although the semiconductor bodies of the example were of wafer thickness, the invention can be applied to the bonding of a free-standing thin film to another semiconductor body.

The oxides of III-V semiconductors are relatively unstable chemical compounds. Therefore, in fusing two III-V semiconductor bodies, the hydrogen is able to reduce the oxides so that the two semiconductors come into intimate contact and chemically fuse. On the other hand, silicon dioxide is an extremely stable chemical compound which hydrogen cannot reduce at reasonable temperatures compatible with III-V materials, particularly when device structures have already been formed. Therefore, the above method cannot fuse one III-V semiconductor body to a silicon body unless less thermally stable oxides are formed on Si using special procedures, such as those disclosed by Grundmann et al. in "Low-temperature metalorganic chemical vapor deposition of InP on Si(001)," *Applied Physics Letters*, volume 58, 1991, pp. 284-286 and by Eaglesham et al. in "Low-temperature growth of Ge on Si(100)," ibid., pp. 2276-2278.

However, the same effect can be achieved with silicon by replacing the hydrogen with a strong liquid acid, such as hydrofluoric acid (HF), to dissolve the silicon oxide layer. Furthermore, when the two bodies are placed together with very gentle pressure and with very little HF between them, the bodies are weakly bonded together by a van der Waals bond so that the bonded assembly can be removed intact from the acid and further processed. Better bonding is achieved by minimizing the amount of HF at the interface. After removal from the acid, the two bodies are pressed together with moderate pressure and are annealed at a temperature sufficient to allow only one of the semiconductor compositions to atomically rearrange.

EXAMPLE 2

A Si wafer was fusion bonded to an InP wafer using HF to reduce the silicon dioxide. Both the InP and Si wafer were lightly swabbed with cotton-tipped swabs soaked in methanol to remove any dust or other particles, and they were then degreased. The InP wafer was placed in a tray containing liquid HF. The Si wafer was placed on the HF, in which it floats. The Si wafer was then gently pushed down through the HF onto the InP wafer until their two surfaces came into proximate contact. The HF assured that the two surfaces were free of oxide upon contact. The two wafers can be aligned if necessary during this initial contacting operation. The two wafers adhered to each other due to van der Waal forces and were lifted out of the acid as one wafer assembly. Any residual acid remaining between the wafers was removed by centrifugal forces during five minutes in which the wafer assembly was spun on a spin drier.

The wafer assembly was then placed in the OMCVD reactor through which flowed ultra-high purity hydrogen with the InP contacting the susceptor. A weight was placed on the wafer assembly so as to exert a pressure of about 200-400 gm/cm$^2$ across the interface. The temperature was raised to 650° C. so as to anneal the assembly for about 30 minutes. The fused wafers were then cooled to room temperature in the hydrogen ambient.

The wafers were determined to be chemically bonded. Cross-sectional TEM indicated that the InP-Si interface contained misfit dislocations approximately 5 nm apart, as is expected from a chemically bonded interface. The crystalline bodies extended to the interface with no oxide between them.

This same process could be used to bond GaAs directly to Si although slightly higher temperatures would be required to atomically rearrange the GaAs.

Figure 4:
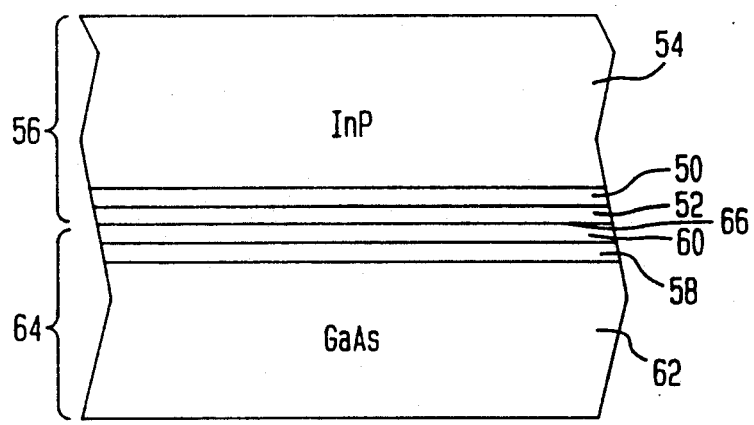
FIGS. 4 through 6 are cross-sections illustrating a method of practicing a second embodiment of the invention.
Figure 5:
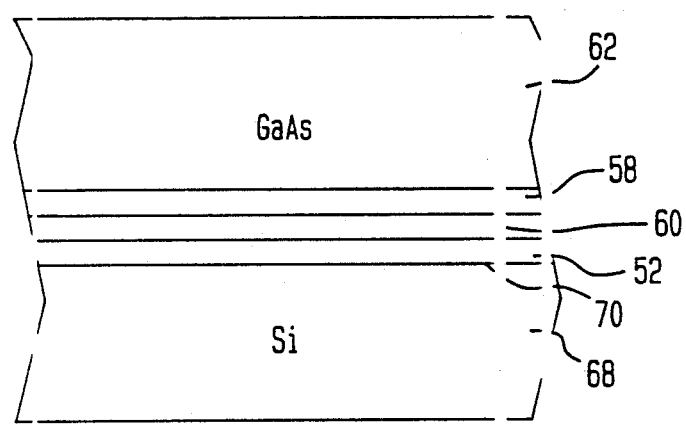
Figure 6:
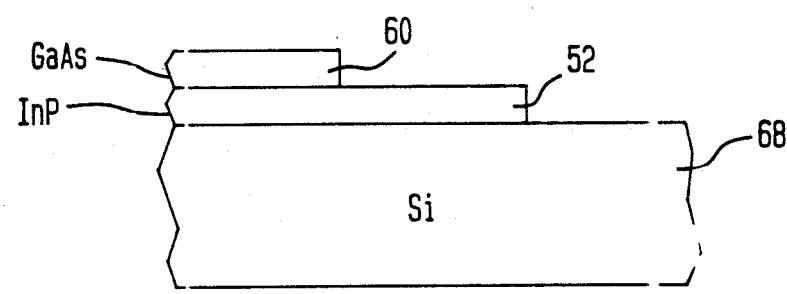

Both InP and GaAs can be bonded on a Si substrate by the process illustrated in FIGS. 4-6. As shown in FIG. 4, a first growth process epitaxially deposits a lattice-matched GaInAs etch stop layer 50 and an InP epi-layer 52 on an InP substrate 54 so as to form an InP wafer 56. Similarly, a second growth process epitaxially deposits an AlAs etch-stop layer 58 and a GaAs epi-layer 60 on a GaAs substrate 62 so as to form a GaAs wafer 58. The two wafers 56 and 64 are then bonded together following the process of either Example 1 or Example 2 so that the InP and GaAs layers 52 and 60 are joined across a first bonded interface 66.

In a two-step etching process, both the InP substrate 54 and the GaInAs etch-stop layer 50 are removed so as to expose the InP epi-layer 52 supported on the GaAs substrate 62. This assembly is then bonded, as shown in FIG. 5, to a Si substrate 68 following the process of Example 2 so that the InP epi-layer 52 is joined to the Si substrate 68 across a second bonded interface 70.

In another two-step etching process, both the GaAs substrate 62 and the AlAs etch-stop layer 58 are removed so as to leave the GaAs epi-layer 60 and the InP epi-layer 52 supported on the Si substrate 68. Then, a two-step lithographic process removes portions of the GaAs epi-layer 60 and of the InP epi-layer 52 so as to leave portions of GaAs, InP, and Si exposed for processing into respective circuits.

Although the above example fused the InP and GaAs wafers at 650° C., the fusion should produce a high quality hetero-interface for a range of temperatures around the lowest of the two optimal epitaxial deposition temperatures. The process of Example 2 has bonded InP and GaAs at 550° C.

The invention thus allows for low-temperature and low-pressure fusion of two bodies having dissimilar semiconductor compositions. The conditions are gentle enough to not disturb previously deposited layers nor to cause them to interdiffuse. Nonetheless, the quality of the fused semiconductor body nearly resembles that of a completely epitaxially deposited body. The invention has particular applicability to the integration of InP-based opto-electronic components with GaAs electronic components or the integration of either of these with Si electronic components.

What is claimed is:

1. A fusion method, comprising the steps of:

placing a first surface of a first body comprising a first semiconductor in contact with a second surface of a second body comprising a second semiconductor;

exposing said bodies to a fluid capable of reducing an oxide of at least one of said semiconductors; and annealing said bodies placed in contact at a temperature not substantially higher than the lowest of respective temperatures of atomic rearrangement of said first and second semiconductors on said first and second surfaces respectively.

2. A fusion method as recited in claim 1, wherein both said semiconductors comprise compound semiconductors.

3. A fusion method as recited in claim 2, further comprising pressing said bodies together with a pressure considerably less than 10 kg/cm$^2$ during said annealing step and while said bodies are being exposed to said fluid comprising a gas.

4. A fusion method as recited in claim 1, wherein one of said semiconductors comprises silicon and said fluid comprises a liquid acid.

5. A fusion method as recited in claim 4, wherein said liquid acid comprises HF.

6. A fusion method as recited in claim 1, wherein said annealing step produces a higher temperature in the one of said bodies having said lowest temperature of atomic rearrangement than in the other of said bodies.

7. A fusion method, comprising the steps of:
placing a first surface of a first body and comprising a first compound semiconductor in contact with a second surface of a second body and comprising a second compound semiconductor;

pressing said two bodies together with a pressure substantially less than 10 kg/cm$^2$; and heating said two bodies pressed together to a fusing temperature.

8. A fusion method as recited in claim 7, wherein said fusing temperature approximately equals the lowest of respective optimal epitaxial deposition temperatures of said two surfaces.

9. A fusion method as recited in claim 7, wherein a first one of said bodies has a higher vapor pressure than a second one of said bodies and said heating step heats said first body to a higher temperature than said second body.

10. A fusion method as recited in claim 7, wherein said first compound semiconductor includes indium as a major constituent and said second compound semiconductor includes gallium as a major constituent.

11. A fusion method as recited in claim 7, further comprising etching said surfaces prior to said placing step.

12. A fusion method as recited in claim 11, further comprising flowing hydrogen over said bodies during said heating step.

13. A fusion method as recited in claim 7, wherein said first surface comprises indium and phosphorus and said second surface comprises gallium and arsenic and said fusing temperature is in a range extending approximately from 550° C. to 650° C.

14. A fusion method as recited in claim 13, further comprising:
etching said surfaces prior to said placing step; and
flowing hydrogen over said bodies during said heating step.

15. A fusion method as recited in claim 13, wherein said first body comprises a plurality of layers beneath said first surface and said second body comprises a GaAs substrate.

16. A fusion method, comprising:
bathing a first surface of a first body comprising a compound semiconductor and a second surface of a second body comprising silicon in an acid capable of dissolving silicon dioxide;

contacting said first and second surfaces while they are being bathed by said acid; and annealing said first and second bodies while said first and second surfaces are contacted.

17. A fusion method as recited in claim 16, wherein said acid comprises HF.

18. A fusion method as recited in claim 17, further comprising pressing said first and second bodies together during said annealing step.

* * * * *